United States Patent
Sasaki et al.

(10) Patent No.: US 8,513,803 B2
(45) Date of Patent: Aug. 20, 2013

(54) SEMICONDUCTOR DEVICE AND STACKED SEMICONDUCTOR DEVICE

(71) Applicant: Elpida Memory, Inc., Tokyo (JP)

(72) Inventors: Dai Sasaki, Tokyo (JP); Mitsuaki Katagiri, Tokyo (JP); Hisashi Tanie, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/692,222

(22) Filed: Dec. 3, 2012

(65) Prior Publication Data

US 2013/0093083 A1    Apr. 18, 2013

Related U.S. Application Data

(62) Division of application No. 12/641,713, filed on Dec. 18, 2009, now abandoned.

(30) Foreign Application Priority Data

Mar. 5, 2009    (JP) ................................ 2009-052067

(51) Int. Cl.
  *H01L 23/498*    (2006.01)

(52) U.S. Cl.
  USPC ........................................................ 257/737

(58) Field of Classification Search
  USPC .................... 257/718, 737, 777, 692
  See application file for complete search history.

(56) References Cited

U.S. PATENT DOCUMENTS

| | | | | |
|---|---|---|---|---|
| 5,461,197 | A | * | 10/1995 | Hiruta et al. ................... 174/528 |
| 6,084,308 | A | * | 7/2000 | Kelkar et al. .................. 257/777 |
| 6,218,731 | B1 | | 4/2001 | Huang et al. |
| 6,444,494 | B1 | | 9/2002 | Muramatsu et al. |
| 6,558,978 | B1 | * | 5/2003 | McCormick .................. 438/108 |
| 6,717,253 | B2 | * | 4/2004 | Yang .............................. 257/686 |
| 6,787,917 | B2 | * | 9/2004 | Lee et al. ...................... 257/777 |
| 8,198,716 | B2 | * | 6/2012 | Periaman et al. ............. 257/686 |
| 2002/0050407 | A1 | | 5/2002 | Sohn et al. |
| 2003/0164550 | A1 | * | 9/2003 | Lee et al. ...................... 257/777 |
| 2007/0069361 | A1 | * | 3/2007 | Chang et al. .................. 257/690 |
| 2008/0001276 | A1 | * | 1/2008 | Lee et al. ...................... 257/686 |
| 2008/0265397 | A1 | * | 10/2008 | Lin et al. ....................... 257/691 |

FOREIGN PATENT DOCUMENTS

| | | |
|---|---|---|
| JP | 09-246331 | 9/1997 |
| JP | 10-144723 | 5/1998 |
| JP | 2006-013553 | 1/2006 |
| JP | 2007-311643 | 11/2007 |

* cited by examiner

*Primary Examiner* — Thao P. Le

(74) *Attorney, Agent, or Firm* — Young & Thompson

(57) ABSTRACT

A semiconductor device according to one embodiment has a wiring circuit board, a semiconductor chip, a die attach material and bumps. The semiconductor chip is mounted on the wiring circuit board. The die attach material is provided between the wiring circuit board and the semiconductor chip. A wiring layer is provided on one surface of the wiring circuit board. Leads are extended from the wiring layer and connected to the semiconductor chip. The bumps are provided at outer positions relative to the region where the semiconductor chip of the wiring circuit board is mounted. The wiring layer in the wiring circuit board is formed on the surface opposite from the surface on which the semiconductor chip is mounted.

20 Claims, 8 Drawing Sheets

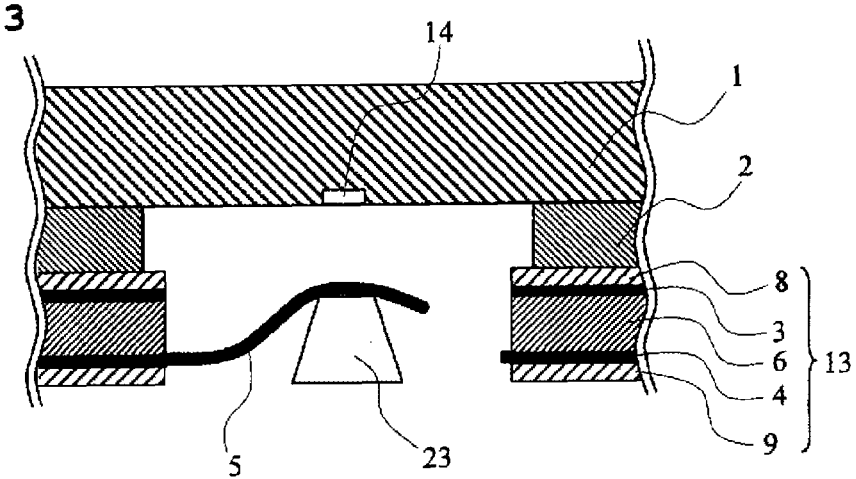
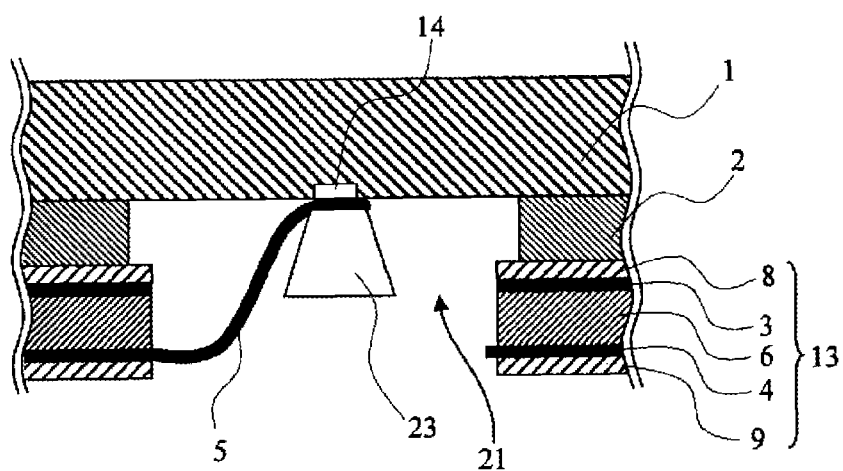
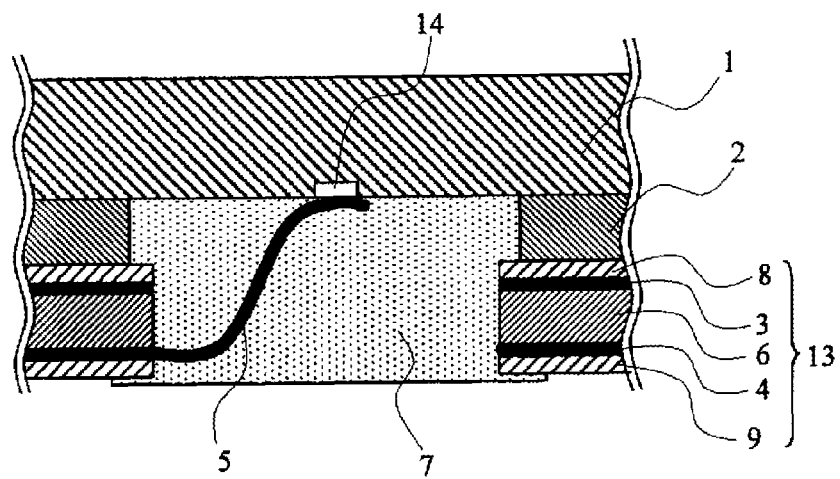

Fig.10A
Fig.10B
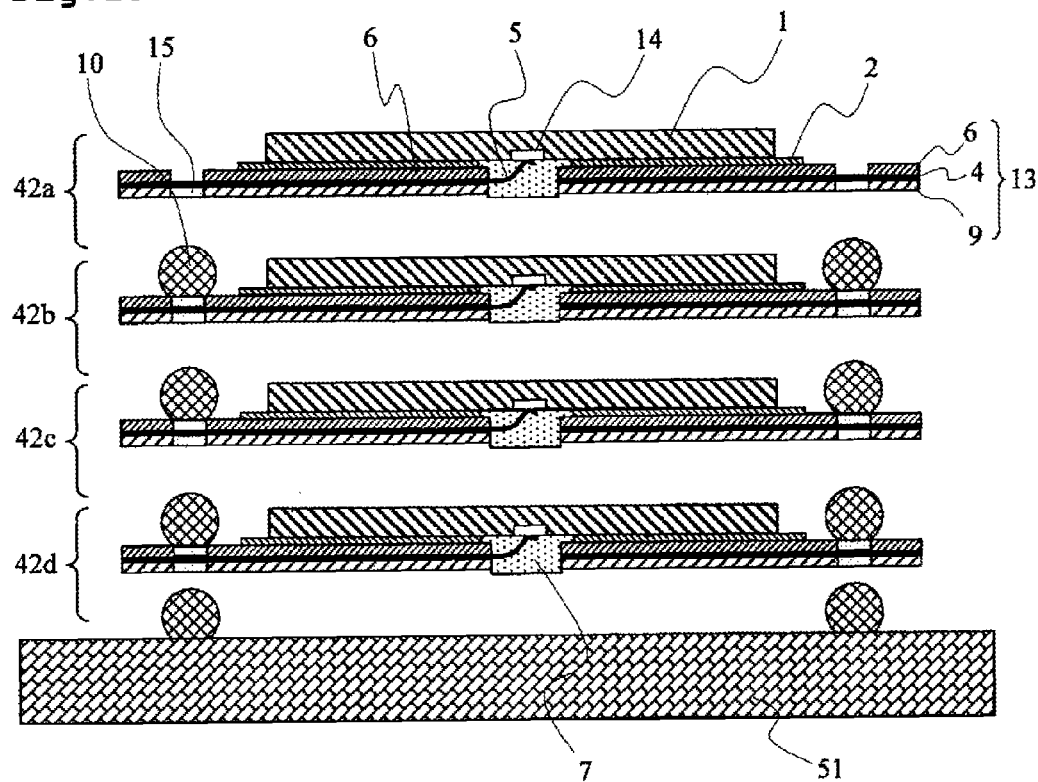
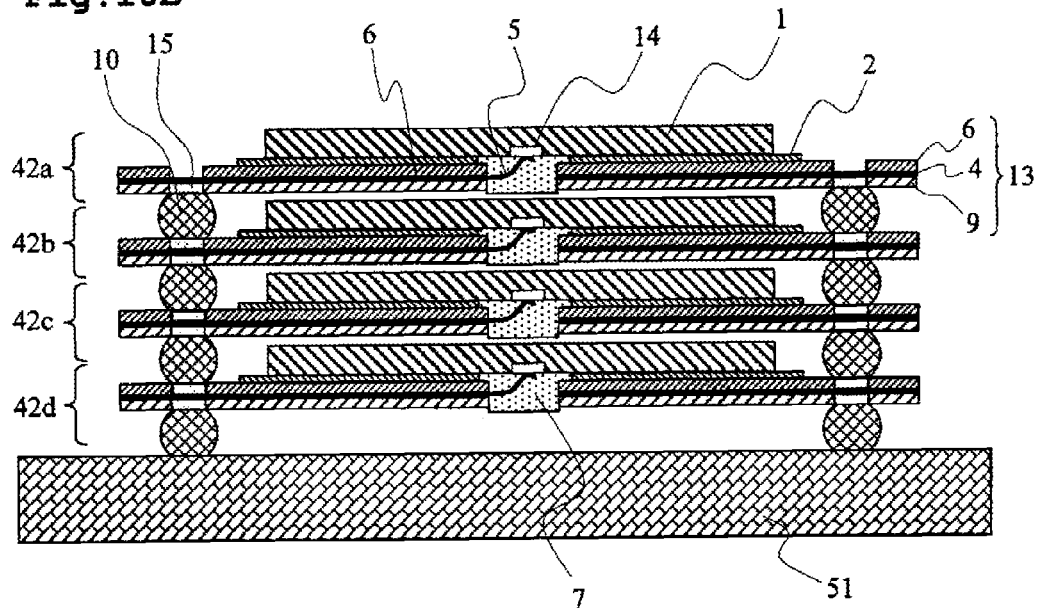

SEMICONDUCTOR DEVICE AND STACKED SEMICONDUCTOR DEVICE

This application is based upon and claims the benefit of priority from Japanese patent application No. 2009-052067, filed on Mar. 5, 2009, the disclosure of which is incorporated herein in its entirety by reference.

BACKGROUND OF THE INVENTION

1. Field of the Invention

The present invention relates to a semiconductor device and a stacked semiconductor device in which a circuit board and a semiconductor chip are connected by leads.

2. Description of Related Art

In recent years, semiconductor devices of a ball grid array (BGA) type or a fine pitch ball grid array (FBGA) type have been used as a semiconductor device in which a semiconductor chip such as a dynamic random access memory (DRAM) is mounted. Also, Japanese Patent Laid-Open No. 2007-311643 and Japanese Patent Laid-Open No. 2006-013553 disclose semiconductor devices of a stacked FBGA (sFBGA) type in which a plurality of FBGA-type semiconductor devices are stacked.

In Japanese Patent Laid-Open No. 2007-311643, an sFBGA-type semiconductor device is described. A semiconductor chip is mounted on a wiring circuit board in the semiconductor device in each layer. Interlayer connection terminals connecting the wiring circuit boards in the layers are disposed in circuit board regions located outside the semiconductor chips.

In Japanese Patent Laid-Open Nos. 2006-013553, 10-144723 and 9-246331, a semiconductor device, in which leads that are provided on a carrier are connected to electrode pads formed on a semiconductor chip, is described. The semiconductor device described in Japanese Patent Laid-Open No. 2006-013553 has a semiconductor chip on which bonding pads are formed and a flexible wiring circuit board (carrier) on which wiring is formed. Leads are projecting from the wiring on the flexible wiring circuit board. The leads are connected to the bonding pads of the semiconductor chip.

The semiconductor chip and the flexible wiring circuit board are connected to each other by an elastomer. A solder resist is formed on the major surface of the flexible wiring circuit board. Solder bumps are connected to bump lands in the wiring on the flexible wiring circuit board. The leads projecting from the wiring circuit board pass through openings formed in the elastomer and the wiring circuit board. The leads are connected to the bonding pads of the semiconductor chip (see FIG. 10 in Japanese Patent Laid-Open No. 2006-013553).

Presently, there is a strong demand for reducing the thickness of semiconductor devices. The inventor of the present invention has found problems described below as a result of a study about the reduction in thickness of semiconductor devices.

In the semiconductor device described in Japanese Patent Laid-Open No. 2006-013553, connecting the leads to the semiconductor chip requires separating the leads and the semiconductor chip by a distance equal to or larger than a predetermined value before connecting (bonding) the leads. This distance is required for press-cutting of the leads with a bonding tool. If this distance is small, the leads can be not cut and connection failure results. Therefore, there is a problem that, if this distance is set larger than the predetermined value, the thickness of the elastomer provided between the semiconductor chip and the circuit board cannot be reduced.

Japanese Patent Laid-Open No. 2006-013553 discloses to reduce the thickness of the semiconductor device. The semiconductor device in Japanese Patent Laid-Open No. 2006-013553 is provided with an elastomer for relaxing stress concentration on the solder bumps due to the difference between the thermal expansion coefficient of the semiconductor chip and the thermal expansion coefficient of a mount substrate. In a semiconductor device having solder balls provided at positions overlapping the chip mount region for the semiconductor chip in particular, a film of an elastomer having a thickness sufficient for stress relaxation is used. For the above-described reasons, it is difficult to reduce the thickness of the semiconductor device described in Japanese Patent Laid-Open No. 2006-013553. The semiconductor devices described in Japanese Patent Laid-Open Nos. 10-144723 and 9-246331 also have solder balls provided at positions overlapping the chip mount region for the semiconductor chip and therefore have the same problem regarding reducing the thickness of the semiconductor devices.

SUMMARY

The present invention seeks to solve one or more of the above problems, or to improve upon those problems at least in part.

In one embodiment, there is provided a device/method/circuit/system that includes a wiring circuit board, a semiconductor chip, a die attach material and bumps. The semiconductor chip is mounted on the wiring circuit board. The die attach material as a connecting member that connect the semiconductor chip to the wiring circuit board is provided between the wiring circuit board and the semiconductor chip. A wiring layer is provided on one surface of the wiring circuit board. Leads are extended from the wiring layer and are connected to the semiconductor chip. The bumps are provided at outer positions relative to the region of the circuit board where the semiconductor chip is mounted. The wiring layer in the wiring circuit board is formed on the surface opposite from the surface on which the semiconductor chip is mounted.

In a stacked semiconductor device in one embodiment, a plurality of the above-described semiconductor devices are stacked with the bumps interposed therebetween.

In the above-described arrangement, the leads that are connected to the semiconductor chip extend from the wiring layer formed on one surface of the wiring circuit board that faces opposite to the surface on which the semiconductor chip is mounted. Therefore, the distance between the wiring layer and the semiconductor chip is large even if the distance between the wiring circuit board and the semiconductor chip is small. It is, therefore, possible to secure the distance necessary for connecting the leads to the semiconductor chip. Further, since the bumps are provided at outer positions relative to the chip mount region of the wiring circuit board, shearing deformation that is caused in the bumps is reduced. The need for the die attach material to have a function for reducing stress in the wiring circuit board is thereby eliminated to enable reducing the thickness of the die attach material. As a result, reductions in thickness of the semiconductor device and the stacked semiconductor device are achieved.

The above and other objects, features and advantages of the present invention will become apparent from the following description with reference to the accompanying drawings which illustrate examples of the present invention.

BRIEF DESCRIPTION OF THE DRAWINGS

The above features and advantages of the present invention will be more apparent from the following description of certain preferred embodiments taken in conjunction with the accompanying drawings, in which:

FIG. 3 is a schematic diagram for explaining one step for manufacturing the semiconductor device shown in FIG. 1;

FIG. 4 is a schematic diagram for explaining one step for manufacturing the semiconductor device shown in FIG. 1;

FIG. 5 is a schematic diagram for explaining one step for manufacturing the semiconductor device shown in FIG. 1;

FIGS. 10A and 10B are schematic diagrams showing another method of manufacturing the stacked semiconductor device shown in FIG. 8;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

<First Embodiment>

Figure 1:
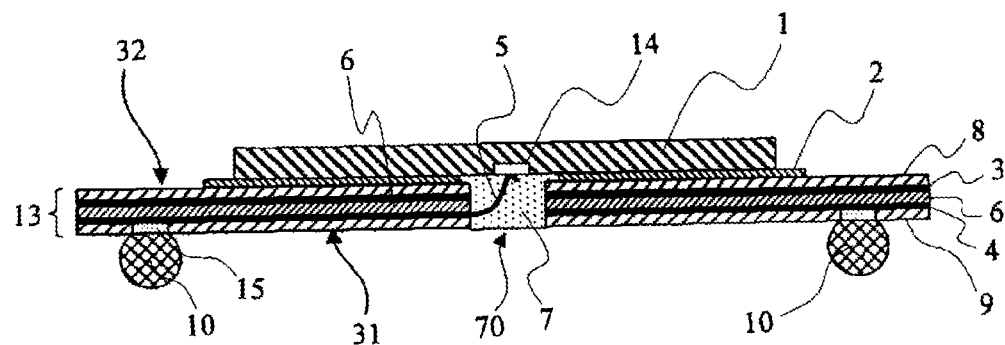
FIG. 1 is a schematic sectional view of a semiconductor device according to a first embodiment.

FIG. 1 is a schematic sectional view of a semiconductor device according to a first embodiment of the present invention. The semiconductor device has wiring circuit board 13 as a package substrate, a semiconductor chip 1 and a plurality of bumps electrodes 10.

Wiring circuit board 13 has core (or base) member 6 and wiring layers (or patterns) 3 and 4. Wiring layers 3 and 4 are formed on both surfaces of core member 6. Insulating layers 8 and 9 as a solder-resist film are formed on both wiring layers 3 and 4. Of the wiring layers 3 and 4, there are ones which are electrically connected to each other by vias (not shown) that pass through core member 6. Each of the vias includes a hole provided in the core member 6 and a conductive material filling the hole. The wiring circuit board 13 further includes an through-hole (or opening) 70 and leads 5 extending from wiring layer 4 formed in one surface 31 of wiring circuit board 13 and projecting (elongating) over the through-hole 70.

Semiconductor chip 1 is mounted on wiring circuit board 13 with die attach material 2 interposed therebetween. In the present embodiment, semiconductor chip 1 is mounted on chip mount surface 32 of wiring circuit board 13 with spaces left at least in the vicinities of both side parts of wiring circuit board 13. In this specification, "chip mount surface" refers to one surface of wiring circuit board 13 on which semiconductor chip 1 is mounted. In other words, the chip 1 is mounted on the wiring circuit board 13 on the side of the wiring layer 13 such that the electrodes 14 of the chip 1 are exposed by the through-hole 70 of the wiring board 13.

Bumps 10 are provided in the vicinities of both edge parts of the surface of wiring circuit board 13 opposite to chip mount surface 32. Solder balls can be used as bumps 10. As described above, bumps 10 are provided at outer positions relative to the chip mount region of wiring circuit board 13. "Chip mount region" denotes the region on wiring circuit board 13 where semiconductor chip 1 is mounted. In other words, the surface of the core member 6, on which the wiring patterns 3 are formed, includes the chip mount region and the peripheral region around (i.e., outside) the chip mount region, and the opposite surface of the core member 6, on which the wiring patterns 4 are formed, includes the corresponding regions respectively to the chip mount region and the peripheral region. In this embodiment, the bump electrodes 10 are formed over the region of the surface of the core member 6 having the wiring patterns 4, which region corresponds to the peripheral region of the surface of the core member 6 having the wiring patterns 3.

Leads 5 are formed integrally with wiring layer 4. Leads 5 that project from wiring layer 4 are bent in the through-hole 70 and connected to the electrodes 14 of the semiconductor chip 1.

That is, one end of each lead 5 is integrally connected to wiring layer 4 and the other end of lead 5 is connected to semiconductor chip 1. The through hole 70 is filled with sealing material 7. Therefore, leads 5 are protected by sealing material 7. As sealing material 7, a sealing resin for example can be used.

In the present embodiment, wiring layer 4 from which the leads extend is opposed to the surface that faces semiconductor chip 1. Therefore, the distance between wiring layer 4 from which the leads extend and semiconductor chip 1 is substantially equal to the sum of the thickness of wiring circuit board 13 and the thickness of die attach material 2. As a result, even if the distance between wiring circuit board 13 and semiconductor chip 1, i.e., the thickness of die attach material 2, is small, the distance between wiring layer 4 from which the leads extend and semiconductor chip 1 is increased by an amount corresponding to the thickness of wiring circuit board 13. Thus, the necessary distance for connecting leads 5 to semiconductor chip 1 can be secured even if the thickness of die attach material 2 is small.

The portion in which semiconductor chip 1 and wiring circuit board 13 are connected to each other deforms in a warping manner due to the difference between thermal deformations of semiconductor chip 1 and wiring circuit board 13 when the temperature thereof changes. A thermal deformation of wiring circuit board 13 is ordinarily larger than a thermal deformation of semiconductor chip 1. Therefore, the semiconductor device deforms in such a direction as to be convex on the semiconductor chip side when the temperature decreases, and deforms in such a direction as to be concave on the semiconductor chip side when the temperature rises. With respect to a change in temperature after mounting the semiconductor device on a mount substrate, the difference between thermal deformations of the semiconductor device and the mount substrate is reduced by the warping deformation of the semiconductor device. As a result, a shearing deformation caused in bumps 10 connecting the semiconductor device and the mount substrate is reduced.

If bumps 10 are provided in a region corresponding to the chip mount region on wiring circuit board 13, bumps 10 restrain warping deformations of semiconductor chip 1 and wiring circuit board 13. A shearing deformation caused in bumps 10 is thereby increased.

In the present embodiment, bumps 10 are provided at outer positions relative to the chip mount region on wiring circuit board 13. Therefore, warping deformation of semiconductor chip 1 and wiring circuit board 13 is caused so that the difference between thermal deformations of semiconductor chip 1 and wiring circuit board 13 is reduced. As a result, the shearing deformation caused in bumps 10 is reduced.

Since the shearing deformation of bumps 10 is limited, it is not necessary for die attach material 2 to have a function for reducing stress in wiring circuit board 13. Therefore the thickness of die attach material 2 can be reduced. Further, the distance between wiring layer 4 from which the leads extend and semiconductor chip 1 is increased by the amount corresponding to the thickness of wiring circuit board 13, as described above. Therefore, the necessary distance for cutting leads 5 and connecting leads 5 to semiconductor chip 1 can be secured even if the thickness of die attach material 2 is small. As a result, the semiconductor device is reduced in thickness.

If wiring circuit board 13 is a flexible wiring circuit board such as a circuit board tape, the effect of limiting a shearing deformation caused in bumps 10 is further improved. Therefore, a flexible wiring circuit board is preferred to a non-flexible wiring circuit board.

In the present embodiment, since it is not necessary for die attach material 2 to have a stress reducing function, a die attach paste (DAP) or a die attach film (DAF) can be used as die attach material 2 as well as an elastomer. For example, films in the CRM-1100 series from SUMITOMO BAKELITE Co., Ltd. can be used as a DAP, and films in the NEX series from Nippon Steel Chemical Co., Ltd. can be used as a DAF. A DAP or DAF is thinner than elastomer and other low-elasticity members and, therefore, enables a further reduction in the thickness of the semiconductor device.

A method of manufacturing the semiconductor device according to the first embodiment will be described with reference to FIGS. 2 to 5. Wiring circuit board 13 having wiring layers 3 and 4 formed on both surfaces of core member 6 is first prepared. Wiring circuit board 13 includes insulating layers 8 and 9 formed on wiring layers 3 and 4. Wiring circuit board 13 has through hole 21 formed through wiring circuit board 13. Leads 5 which extend over through hole 21 are formed integrally with wiring layer 4 that is formed on one surface 31 of wiring circuit board 13.

Figure 2:
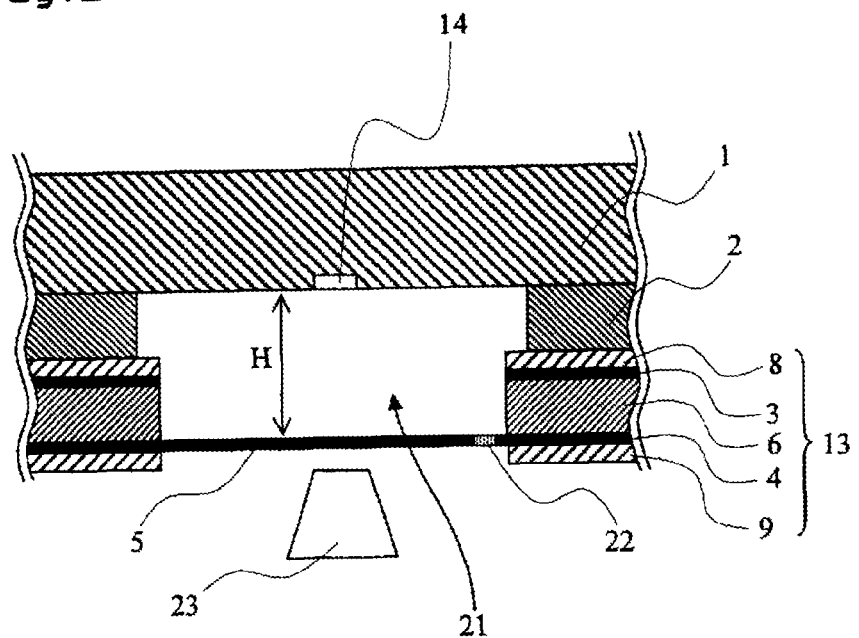
FIG. 2 is a schematic diagram for explaining one step for manufacturing the semiconductor device shown in FIG. 1.

Next, semiconductor chip 1 is mounted on wiring circuit board 13 with die attach material 2 interposed therebetween (see FIG. 2). Semiconductor chip 1 has electrode pads 14 on its surface. Electrode pads 14 are positioned at through hole 21 of wiring circuit board 13.

At this time, leads 5 are not still cut but are in the form of a band generally parallel to the surface of semiconductor chip 1. Distance H between leads 5 and electrode pads 14 is substantially equal to the sum of the thickness of wiring circuit board 13 and the thickness of die attach material 2. Distance H can be adjusted through the thicknesses of wiring circuit board 13 and die attach material 2.

Next, bonding tool 23 is pressed against leads 5 to cut leads 5 at cutting positions 22 (see FIG. 3). Bonding tool 23 is pressed to connect leads 5 to electrode pads 14 (see FIG. 4). As a method for connecting the leads, ultrasound connection, thermo-compression or the like is used.

It is preferred that distance H between leads 5 and electrode pads 14 be a minimum distance necessary for cutting leads 5. The thickness of the semiconductor device can be reduced by setting the distance to be the minimum amount that is needed for cutting leads 5. Distance H is adjustable in advance through the thicknesses of wiring circuit board 13 and die attach material 2.

Next, through hole 21 of wiring circuit board 13 is filled with sealing material 7 (see FIG. 5). Electrode pads 14 of semiconductor chip 1 and leads 5 are protected by sealing material 7. Bumps 10, e.g., solder balls or the like are thereafter formed on wiring circuit board 13. More specifically, bumps 10 are provided at outer positions relative to the chip mount region on wiring circuit board 13.

<Second Embodiment>

Figure 6:
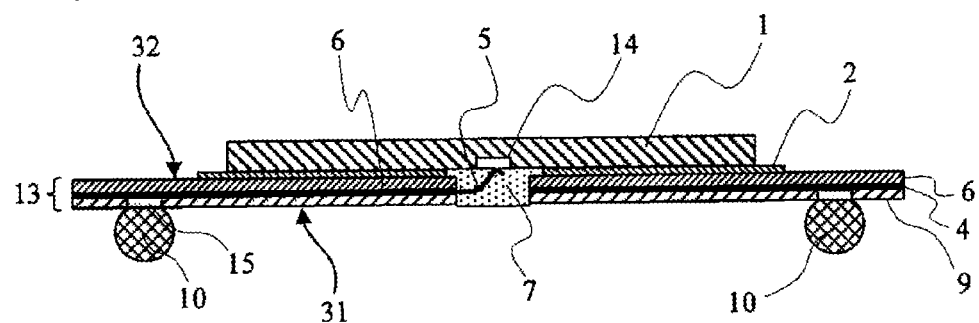
FIG. 6 is a schematic sectional view of a semiconductor device according to a second embodiment.

FIG. 6 is a schematic sectional view of a semiconductor device according to a second embodiment of the present invention. While wiring layers 3 and 4 are formed on the both surfaces of core member 6 in the semiconductor device of the first embodiment, wiring layer 4 is formed only on one surface of core member 6 corresponding to surface 31 in the semiconductor device of the present embodiment.

Leads 5 project from wiring layer 4. Wiring layer 4 formed on one surface 31 of wiring circuit board 13 is provided opposite from semiconductor chip 1. In other respects, the construction is the same as that in the first embodiment. The corresponding description will not be repeated. Also, in the present embodiment, the thickness of the semiconductor can be reduced, as in the first embodiment.

<Third Embodiment>

Figure 7:
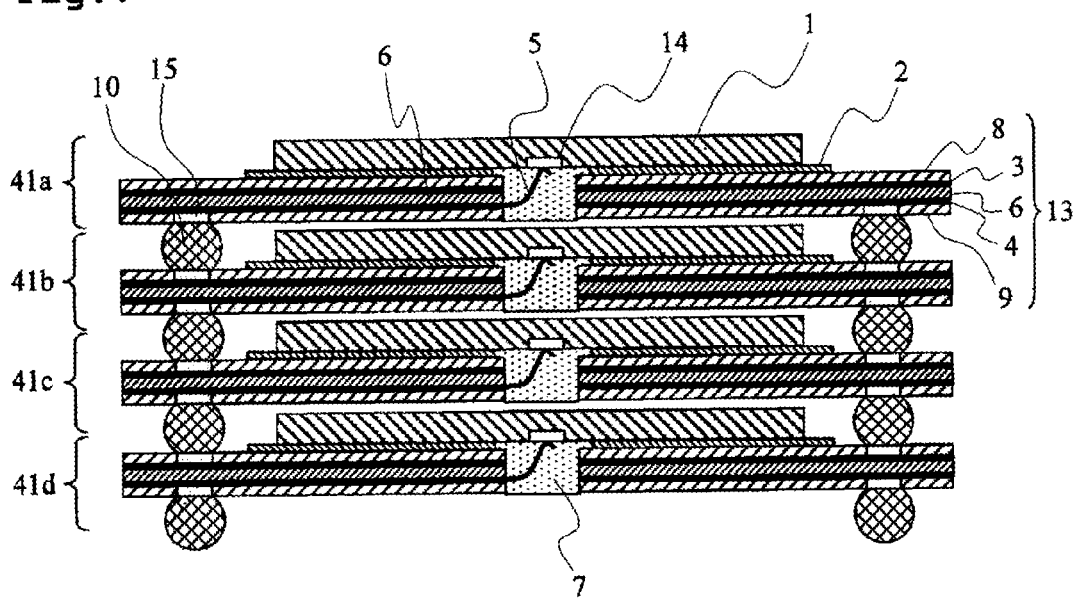
FIG. 7 is a schematic sectional view of a stacked semiconductor device according to a third embodiment.

FIG. 7 is a schematic sectional view of a stacked semiconductor device according to a third embodiment of the present invention. The stacked semiconductor device in the present embodiment is formed by stacking four semiconductor devices 41a, 41b, 41c, and 41d. The construction of each of semiconductor devices 41a, 41b, 41c, and 41d is the same as that of the semiconductor device described in the first embodiment. Semiconductor devices 41a, 41b, 41c, and 41d are connected one to another by bumps 10. More specifically, bumps 10 that the semiconductor device in one layer has are connected to wiring layer 3 of wiring circuit board 13 of the semiconductor device in the next lower layer.

In the present embodiment, the entire stacked semiconductor device is reduced in thickness because each of individual semiconductor devices 41a, 41b, 41c, and 41d is reduced in thickness, as is that in the first embodiment. Bumps 10 that are in one layer of the semiconductor device are disposed by being set apart from the region where semiconductor chip 1, that is in the next lower layer of the semiconductor device, is mounted. Therefore, as can also be understood from FIG. 7, the thickness of the stacked semiconductor device is smaller than the sum of the thicknesses of the four semiconductor devices.

<Fourth Embodiment>

Figure 8:
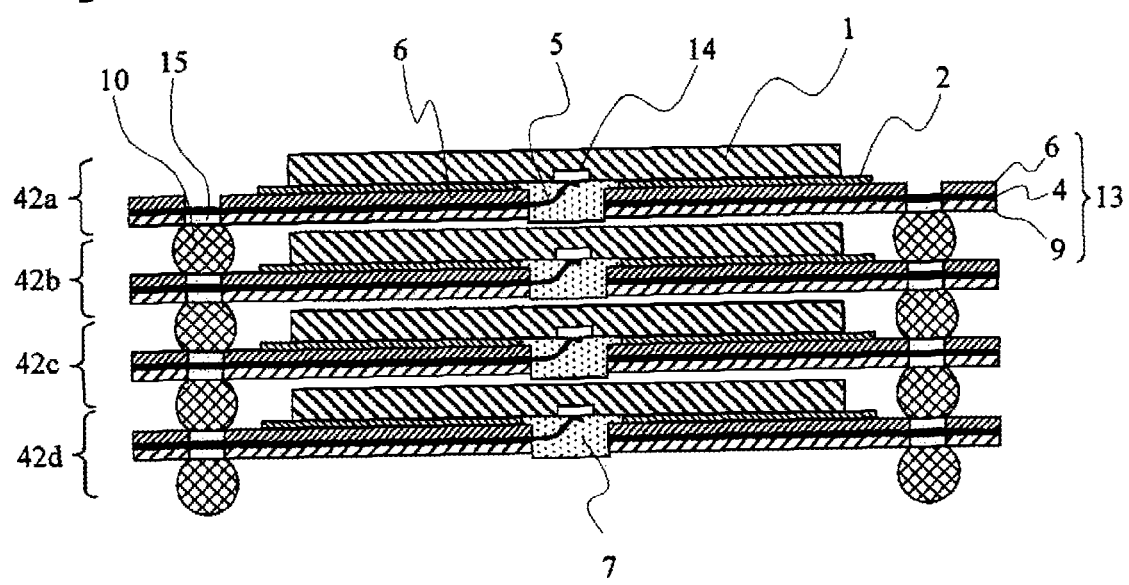
FIG. 8 is a schematic sectional view of a stacked semiconductor device according to a fourth embodiment.

FIG. 8 is a schematic sectional view of a stacked semiconductor device according to a fourth embodiment of the present invention. The stacked semiconductor device in the present embodiment has a stack of four semiconductor devices 42a, 42b, 42c, and 42d. The construction of each of semiconductor devices is the same as that of the semiconductor device described as the second embodiment. That is, wiring layer 4 is formed on only one surface of core member 6 that is present in each semiconductor. Also in this case, the same advantage as that of the third embodiment can be obtained.

Figure 9A:
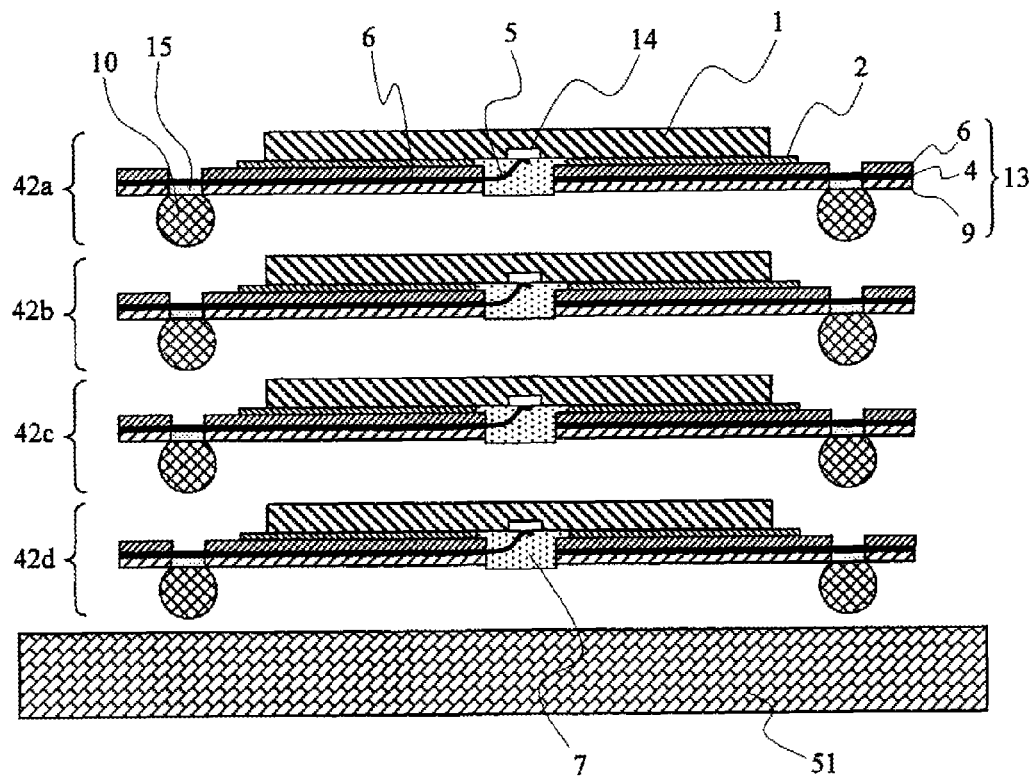
FIGS. 9A and 9B are schematic diagrams showing a method of manufacturing the stacked semiconductor device shown in FIG. 8.

A method of manufacturing the stacked semiconductor device according to the present embodiment will be described with reference to FIGS. 9A and 9B. Each semiconductor device is first manufactured (see FIG. 9A). Each semiconductor device can be manufactured by using the semiconductor device manufacturing method described with respect to the above-described first embodiment. In manufacturing each semiconductor device, however, wiring circuit board 13 having wiring layer 4 formed only on one surface of core member 6 is prepared.

Figure 9B:
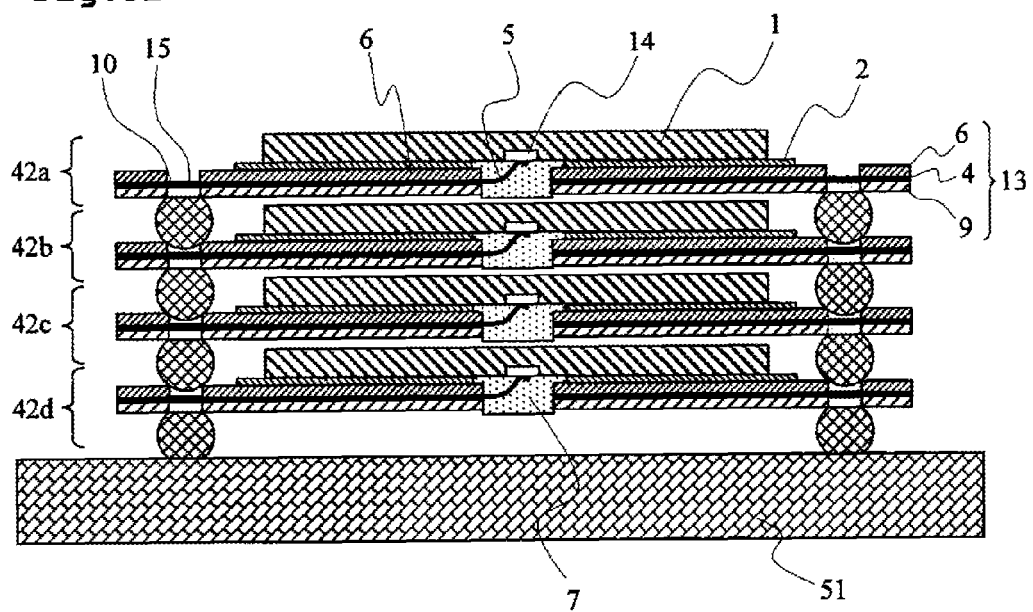

Next, the semiconductor devices are stacked with bumps 10 interposed therebetween (see FIG. 9B). In the present embodiment, wiring layer 4 is formed on only one surface of core member 6. Accordingly, bumps 10 electrically connect wiring layers 4 of wiring circuit boards 13 that are present in the semiconductor devices in each adjacent pair of layers. To enable this connection, holes in which bumps 10 are to be inserted are formed in each core member 6. Bumps 10 are connected to each wiring circuit board, for example, by reflowing. The stacked semiconductor device can be manufactured in the above-described way.

Another method of manufacturing the stacked semiconductor device will be described with reference to FIGS. 10A and 10B. Each semiconductor device is first formed in a state of having no bumps 10 formed. Bumps 10 are then connected to semiconductor devices 42b, 42c, and 42d other than the semiconductor device in the uppermost layer (see FIG. 10A). More specifically, bumps 10 are connected to chip mount surfaces 32 of wiring circuit boards 13 of semiconductor devices 42b, 42c, and 42d. Further, bumps 10 are also connected to mount substrate 51 on which the stacked semiconductor device is to be mounted.

Next, the semiconductor devices are connected through bumps 10. In this case, the stacked semiconductor device can be connected with mount substrate 51 at the same time as the connecting between semiconductor devices.

In this method, bumps such as solder balls are inserted in the holes formed in core members 6 before the semiconductor devices are connected one to another. Therefore the bumps can be suitably inserted in the holes in core members 6. As a result, the occurrence of connection failure between the semiconductor devices can be reduced.

Figure 11A:
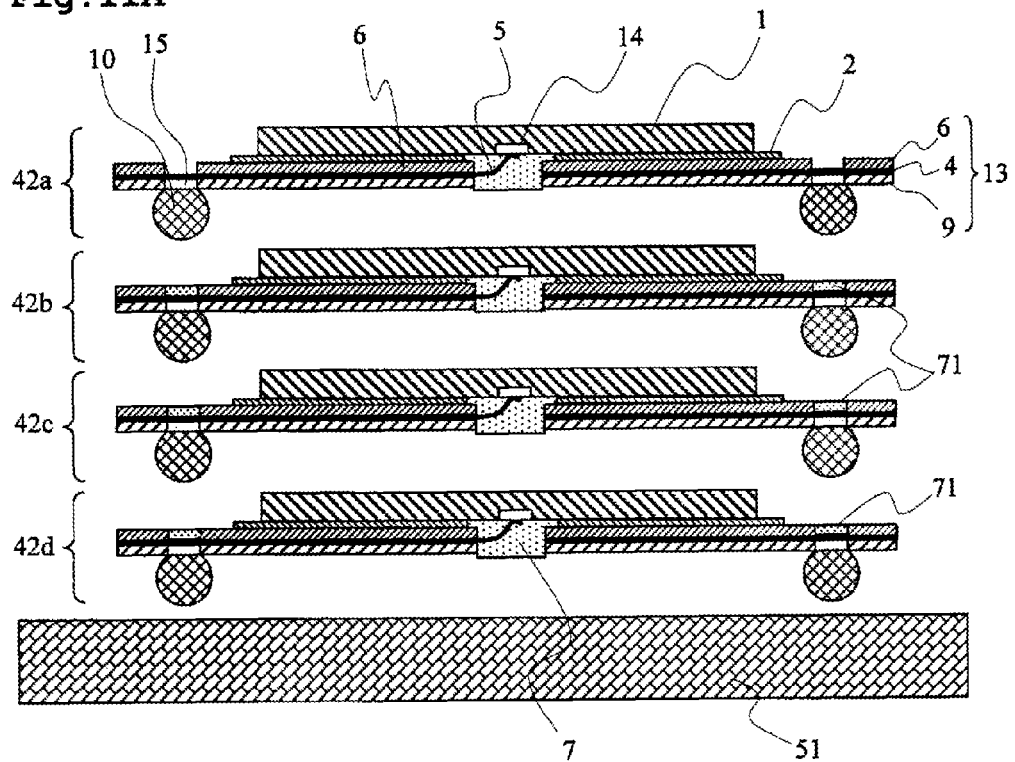
FIGS. 11A and 11B are schematic diagrams showing still another method of manufacturing the stacked semiconductor device shown in FIG. 8.
Figure 11B:
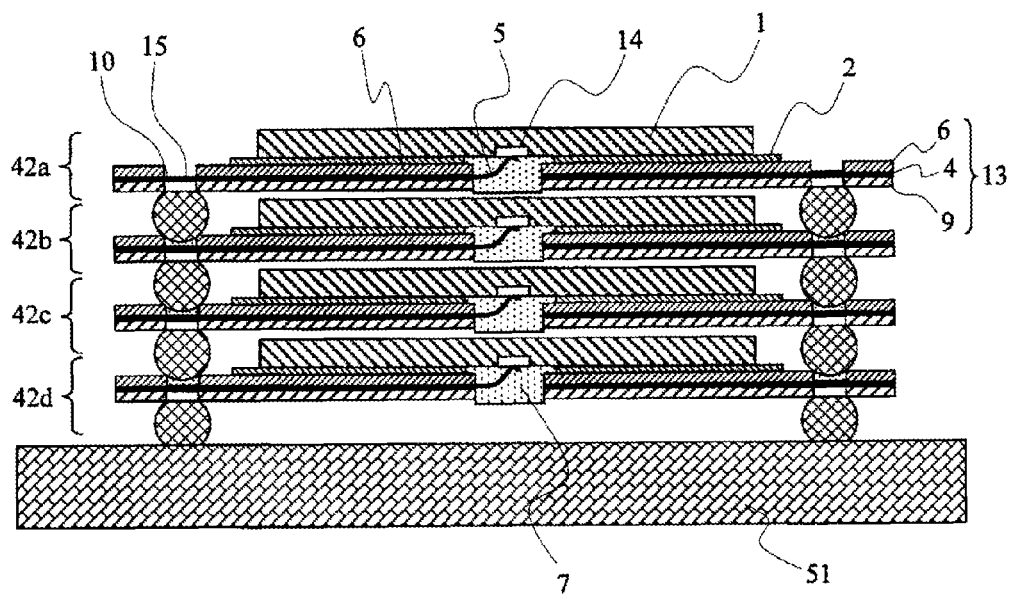

Still another method of manufacturing the stacked semiconductor device will be described with reference to FIGS. 11A and 11B. Each semiconductor device is first manufactured (see FIG. 11A). Next, the holes in core members 6 of semiconductor devices 42b to 42d other than the semiconductor device in the uppermost layer are filled with electrically conductive paste 71.

Semiconductor devices 42a to 42d are connected by bumps 10 each other, as in the above-described manufacturing method. Bumps 10 are connected to each wiring circuit board, for example, by reflowing. This method has the advantage of eliminating the need for forming bumps in advance on mount substrate 51. Also, the occurrence of bump 10 connection failure can be further reduced by filling the holes in core members 6 of the wiring circuit boards with electrically conductive paste 71. Solder in paste form for example can be used as electrically conductive paste 71.

The stacked semiconductor device according to the present embodiment can be manufactured by using any one of the above-described manufacturing methods. Any one of the suitable method may be used the manufacturing methods may be used in conformity with the specifications of the manufacturing apparatus for example.

<Fifth Embodiment>

Figure 12:
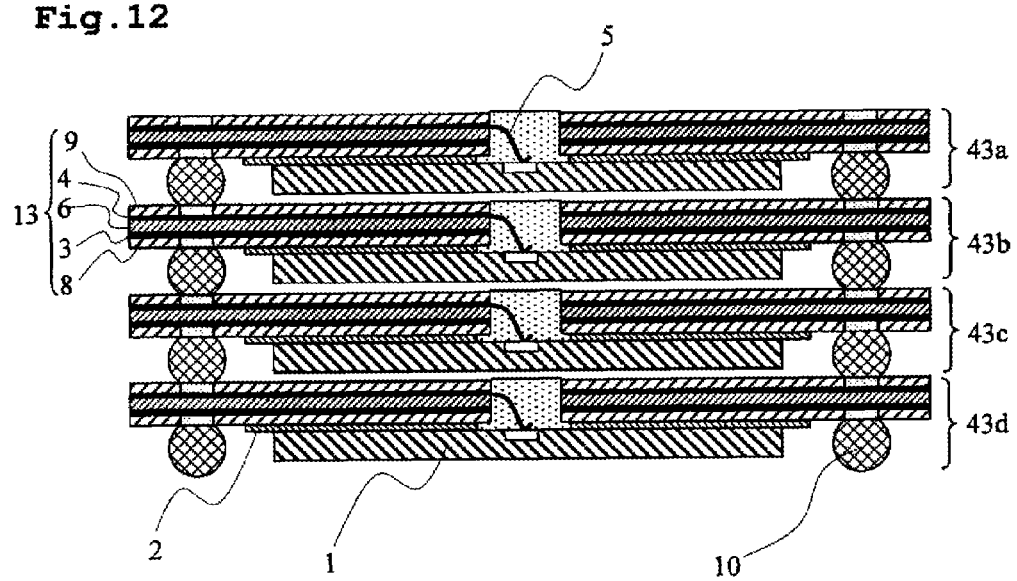
FIG. 12 is a schematic sectional view of a stacked semiconductor device according to a fifth embodiment.

FIG. 12 is a schematic sectional view of a stacked semiconductor device according to a fifth embodiment of the present invention. This stacked semiconductor device differs from that in the third embodiment in that bumps 10 of semiconductor devices 43a, 43b, 43c, and 43d are disposed on chip mount surfaces of wiring circuit boards 13.

Bumps 10 are provided at outer positions relative to the region where semiconductor chip 1 is mounted. Also in the present embodiment, wiring layer 4 integral with leads 5 of wiring circuit boards 13 is opposed to the surface that faces semiconductor chip 1. This enables reducing the thickness of die attach material 2 by the amount corresponding to the thickness of wiring circuit board 13, thus enabling a reduction in the thickness of the semiconductor device.

In the case of the present embodiment, semiconductor chip 1 is faces toward mount substrate 51 when semiconductor chip 1 is mounted on mount circuit board 51. Accordingly, semiconductor chip 1, that is present in semiconductor device 43a in the uppermost layer, is mounted on one surface of wiring circuit board 13 on mount substrate 51 side. In this way, the thickness of the stacked semiconductor device is further reduced.

While the present embodiment has been described with respect to a stacked semiconductor device, the present invention is also applicable to a single-layer semiconductor device.

<Sixth Embodiment>

Figure 13:
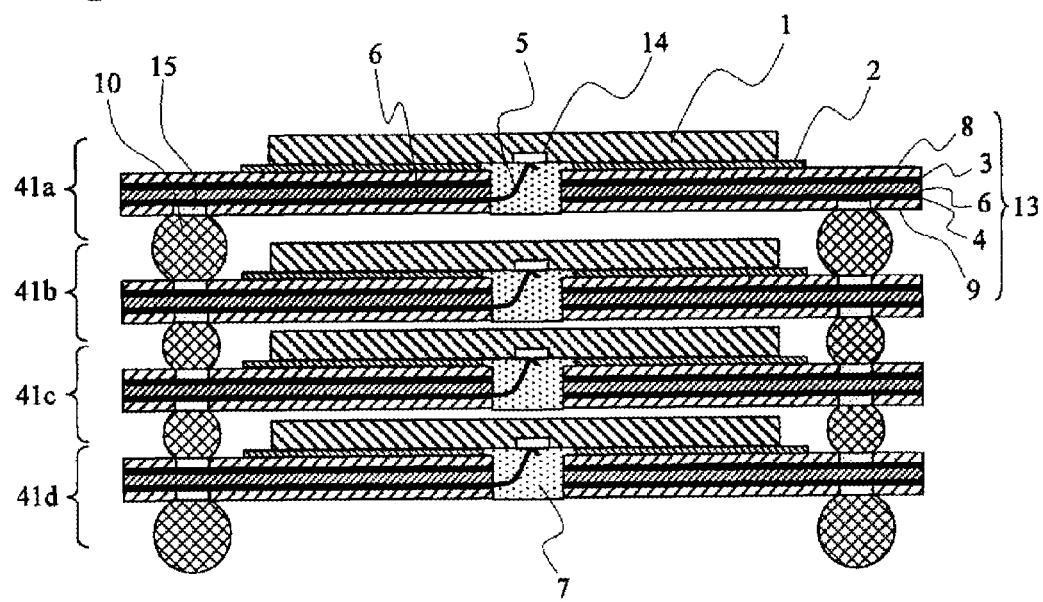
FIG. 13 is a schematic sectional view of a stacked semiconductor device according to a sixth embodiment.

FIG. 13 is a schematic sectional view of a stacked semiconductor device according to a sixth embodiment of the present invention. The construction of the stacked semiconductor device in the present embodiment is generally the same as that of the stacked semiconductor device in the third embodiment but differs in the size of bumps 10. More specifically, in the present embodiment, bumps 10, that are present in semiconductor device 41a in the uppermost layer and that are present in semiconductor device 41d in the lowermost layer, are larger than bumps 10 of semiconductor devices in the other layers. In other respects, the construction is the same as that of the semiconductor device in the third embodiment. The corresponding description will not be repeated.

Wiring circuit boards 13 that are present in semiconductor devices 41a to 41d are deformed each other by heat to substantially equal degrees. Semiconductor device 41d in the lowermost layer is connected to mount substrate 51 through bumps 10. Therefore, a strong load is caused in bumps 10, that are present in semiconductor device 41d in the lowermost layer, due to the difference between a thermal deformation of mount substrate 51 and a thermal deformation of semiconductor device 41d in the lowermost layer.

Since there is no semiconductor device above semiconductor device 41a in the uppermost layer, there is no member supporting semiconductor device 41a in the uppermost layer against deformation of this semiconductor. Therefore, a strong load is also caused in bumps 10 that semiconductor device 41a in the uppermost layer has.

Thus, there is a possibility of a reduction in connection reliability of bumps 10 that are present in semiconductor devices 41a and 41d in the uppermost and lowermost layers. In the present embodiment, bumps 10, that are present in semiconductor devices 41a in the uppermost layer and that are present in semiconductor device 41d in the lowermost layer, are larger than the other bumps. Therefore the reliability of bumps 10 is increased. The connection reliability may be improved by adjusting the sizes of bumps 10 with respect to the stacked semiconductor devices in the fourth and fifth embodiments.

While the third to fifth embodiments have been described with respect to stacked semiconductor devices each having a stack of four semiconductor devices, the number of stacked semiconductor devices may be set to an arbitrary number.

Although the inventions has been described above in connection with several preferred embodiments thereof, it will be appreciated by those skilled in the art that those embodiments are provided solely for illustrating the invention, and should not be relied upon to construe the appended claims in a limiting sense.

The invention claimed is:

1. A semiconductor device comprising:
   a first core member including a first surface and a second surface opposite to the first surface;
   a first semiconductor chip mounted over the first surface of the first core member;
   a plurality of first bumps provided on the second surface of the first core member;
   a second core member including a third surface and a fourth surface opposite to the third surface, the second core member being stacked over the first semiconductor chip so that the fourth surface faces the first semiconductor chip;
   a second semiconductor chip mounted over the third surface of the second core member; and
   a plurality of second bumps provided on the fourth surface of the second core member, the plurality of second bumps being arranged at positions that are outside of a region overlapping the first semiconductor chip, and the plurality of second bumps are smaller in diameter than the plurality of first bumps.

2. The semiconductor device as claimed in claim 1, wherein the second semiconductor chip is electrically coupled to the first bumps via the second bumps.

3. The semiconductor device as claimed in claim 1, wherein the second bumps are arranged at positions that are overlapped to the first bumps in plan view.

4. The semiconductor device as claimed in claim 1, further comprising:
   a first wiring layer provided on the second surface to electrically couple the plurality of first bumps to the first semiconductor chip; and
   a second wiring layer provided on the fourth surface to electrically couple the plurality of second bumps to the second semiconductor chip.

5. The semiconductor device as claimed in claim 1, further comprising:
   a first die attach material provided between the first core layer and the first semiconductor chip, a periphery portion of the first die attach material being arranged at outer portions relative to a region where the first semiconductor chip is mounted; and
   a second die attach material provided between the second core layer and the second semiconductor chip, a periphery portion of the second die attach material being arranged at outer portions relative to a region where the second semiconductor chip is mounted.

6. The semiconductor device as claimed in claim 4, further comprising:
   a plurality of first leads extending from the first wiring layer in the thickness direction of the first core member; and
   a plurality of second leads extending from the second wiring layer in the thickness direction of the second core member.

7. The semiconductor device as claimed in claim 1, further comprising:
   a third core member including a fifth surface and a sixth surface opposite to the fifth surface, the third core member being stacked over the second semiconductor chip so that the sixth surface faces the second semiconductor chip;
   a third semiconductor chip mounted over the fifth surface of the third core member; and
   a plurality of third bumps provided on the sixth surface of the third core member, and the plurality of third bumps are larger in diameter than the plurality of second bumps.

8. A stacked semiconductor device comprising:
   a first semiconductor device including a first core layer, a first semiconductor chip mounted over the first core layer and a plurality of first bumps provided on the first core layer, each of the first bumps including a first diameter; and
   a second semiconductor device including a second core layer, a second semiconductor chip mounted over the second core layer and a plurality of second bumps provided on the second core layer, the second semiconductor device being stacked over the first semiconductor device so that the second bumps electrically couple to the first bumps, the second bumps being arranged at positions that are outside of a region overlapping the first semiconductor chip of the first semiconductor device, and each of the second bumps including a second diameter that is smaller than the first diameter.

9. The stacked semiconductor device as claimed in claim 8, wherein the second semiconductor chip is electrically coupled to the first bumps via the second bumps.

10. The stacked semiconductor device as claimed in claim 8, wherein the second bumps are arranged at positions that are overlapped to the first bumps in plan view.

11. The stacked semiconductor device as claimed in claim 8, wherein the first semiconductor device includes a first wiring layer that is electrically coupled the plurality of first bumps to the first semiconductor chip; and
   the second semiconductor device includes a second wiring layer that is electrically coupled the plurality of second bumps to the second semiconductor chip.

12. The stacked semiconductor device as claimed in claim 8, wherein the first semiconductor device includes a first die attach material that is provided between the first core layer and the first semiconductor chip, a periphery portion of the first die attach material is arranged at outer portions relative to a region where the first semiconductor chip is mounted; and
   the second semiconductor device includes a second die attach material that is provided between the second core layer and the second semiconductor chip, a periphery portion of the second die attach material is arranged at outer portions relative to a region where the second semiconductor chip is mounted.

13. The stacked semiconductor device as claimed in claim 11, wherein the first semiconductor device includes a plurality of first leads that are extending from the first wiring layer in the thickness direction of the first core member; and
   the second semiconductor device includes a plurality of second leads that are extending from the second wiring layer in the thickness direction of the second core member.

14. The stacked semiconductor device as claimed in claim 8, further comprising:
   a third semiconductor device including a third core layer, a third semiconductor chip mounted over the third core layer and a plurality of third bumps provided on the third core layer, the third semiconductor device being stacked over the second semiconductor device so that the third bumps electrically couple to the second bumps, the second bumps being arranged at positions that are outside of a region overlapping the second semiconductor chip of the second semiconductor device, and each of the third bumps including a third diameter that is larger than the second diameter.

15. A semiconductor device comprising:
a first wiring board;
a first semiconductor chip mounted over the first wiring board;
a plurality of first bumps protruding from a surface of the first wiring board;
a second wiring board stacked over the first semiconductor chip, the first semiconductor chip being between the first wiring board and the second wiring board;
a second semiconductor chip mounted over the second wiring board; and
a plurality of second bumps protruding from a surface of the second wiring board, the second bumps being arranged at positions that are outside of a region overlapping the first semiconductor chip,
wherein a height from the surface of the second wiring board to a top of the second bumps is lower than a height from the surface of the first wiring board to a top of the first bumps.

16. The semiconductor device as claimed in claim 15, wherein the second semiconductor chip is electrically coupled to the first bumps via the second bumps.

17. The semiconductor device as claimed in claim 15, wherein the second bumps are arranged at positions that are overlapped to the first bumps in plan view.

18. The semiconductor device as claimed in claim 15, wherein the first wiring board includes a first wiring layer provided on a side of the surface of the first wiring board to electrically couple the plurality of first bumps to the first semiconductor chip; and
the second wiring board includes a second wiring layer provided on a side of the surface of the second wiring board to electrically couple the plurality of second bumps to the second semiconductor chip.

19. The semiconductor device as claimed in claim 15, further comprising:
a first die attach material provided between the first wiring board and the first semiconductor chip, a periphery portion of the first die attach material being arranged at outer portions relative to a region where the first semiconductor chip is mounted; and
a second die attach material provided between the second wiring board and the second semiconductor chip, a periphery portion of the second die attach material being arranged at outer portions relative to a region where the second semiconductor chip is mounted.

20. The semiconductor device as claimed in claim 15, further comprising:
a third wiring board stacked over the second semiconductor chip, the second semiconductor chip being between the second wiring board and the third wiring board;
a third semiconductor chip mounted over the third wiring board; and
a plurality of third bumps protruding from a surface of the third wiring board,
wherein a height from the surface of the third wiring board to a top of the third bumps is higher than a height from the surface of the second wiring board to a top of the second bumps.

* * * * *